United States Patent
Rolfson et al.

(10) Patent No.: US 6,380,100 B2
(45) Date of Patent: Apr. 30, 2002

(54) SEMICONDUCTOR PROCESSING APPARATUSES, AND METHODS OF FORMING ANTIREFLECTIVE COATING MATERIALS OVER SUBSTRATES

(75) Inventors: J. Brett Rolfson; Rodney C. Langley, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/859,203

(22) Filed: May 15, 2001

Related U.S. Application Data

(63) Continuation of application No. 09/136,883, filed on Aug. 19, 1998, now Pat. No. 6,248,671.

(51) Int. Cl.[7] ............... H01L 21/31; H01L 21/469
(52) U.S. Cl. ............... 438/758; 438/509
(58) Field of Search ............... 438/396, 509, 438/644, 751, 758, 770, 787, 107, 398, 636

(56) References Cited

U.S. PATENT DOCUMENTS

| | | | |
|---|---|---|---|
| 4,566,839 A | 1/1986 | Butler | 414/404 |
| 5,566,744 A * | 10/1996 | Tepan | 165/80.1 |
| 5,834,737 A | 11/1998 | Hirose et al. | 219/385 |
| 5,998,766 A | 12/1999 | Mizosaki et al. | 219/390 |
| 6,005,386 A | 12/1999 | Cadwallader et al. | 324/158.1 |
| 6,007,635 A * | 12/1999 | Mahawili | 118/728 |
| 6,228,740 B1 * | 5/2001 | Niroomand et al. | 438/398 |

* cited by examiner

Primary Examiner—David Nelms
Assistant Examiner—Phuc T. Dang
(74) Attorney, Agent, or Firm—Wells St. John P.S.

(57) ABSTRACT

In one aspect, the invention encompasses an apparatus for semiconductor processing comprising: a) at least one support member comprising an upper surface for supporting a semiconductor wafer; b) a component through which the support member extends, the component comprising a front surface and a back surface, at least one of the support member and the component being movable relative to the other of the support member and the component such that the support member can support a wafer in an elevated position above the front surface and can be withdrawn into the component to lower the wafer relative to the front surface of the component; and c) a block joined to the support member below the component back surface, the block engaging the component back surface when the support member upper surface extends above the component to a predetermined distance, the block preventing the support member upper surface from extending beyond the front surface by more than the predetermined distance. In other aspects, the invention encompasses semiconductor processing methods, such as, for example, methods utilizing the above-described apparatus.

18 Claims, 3 Drawing Sheets

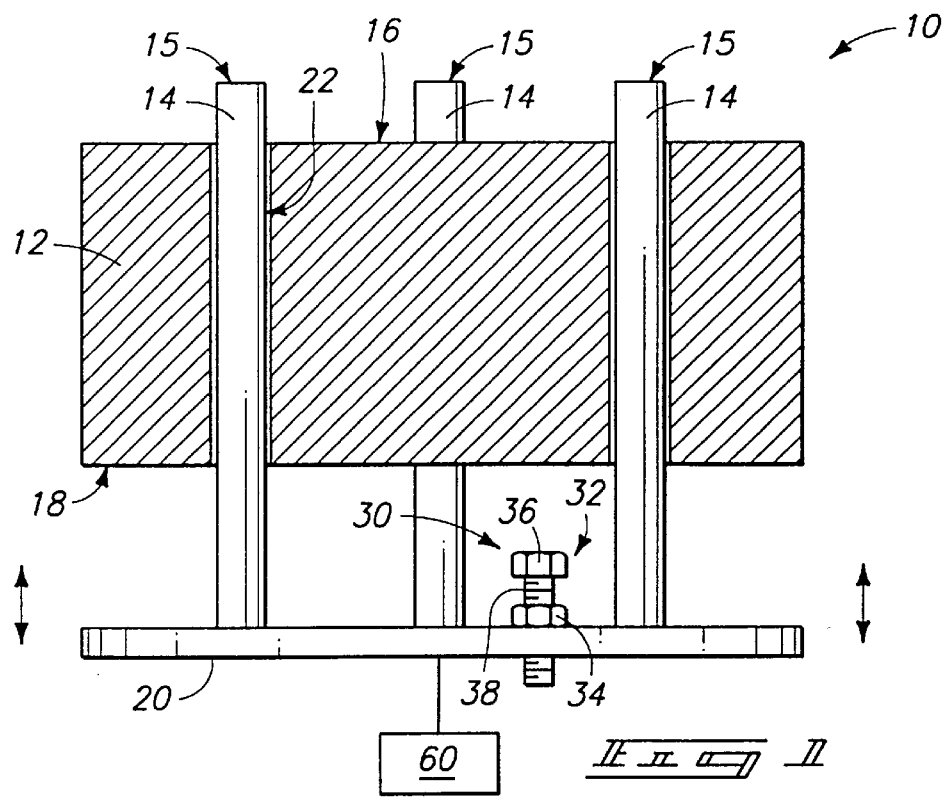
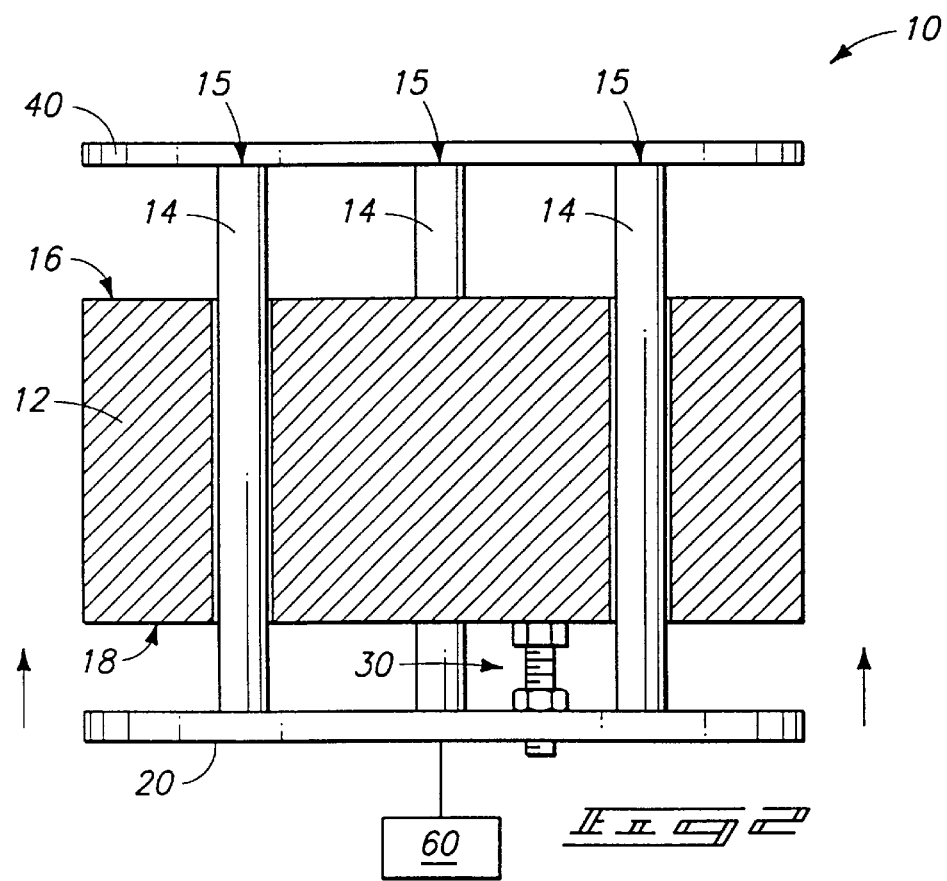

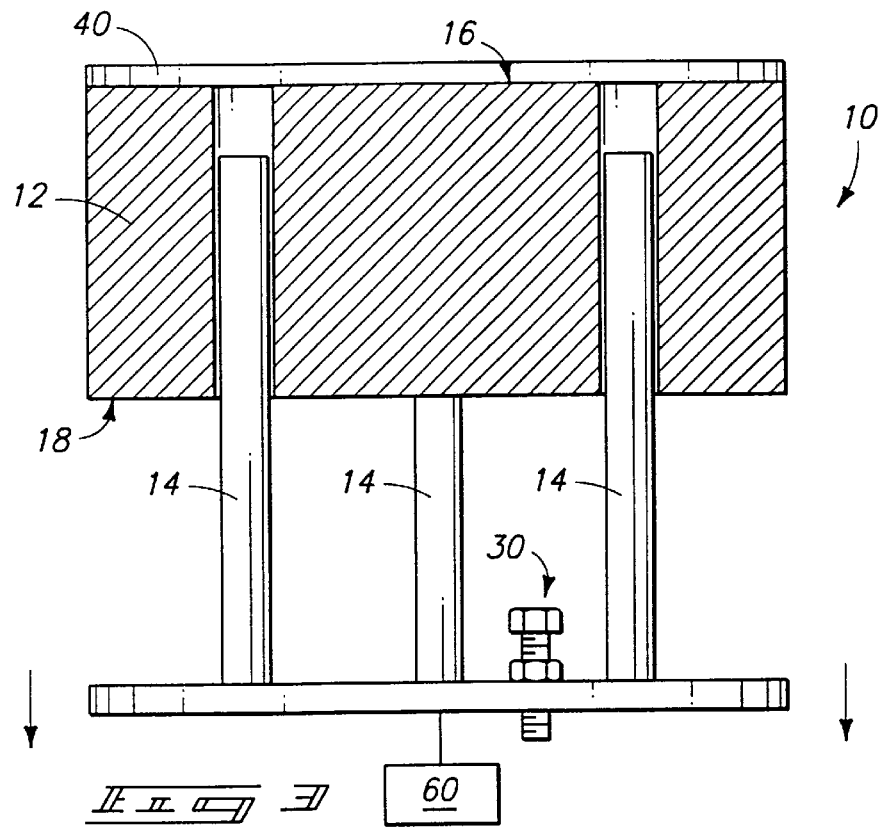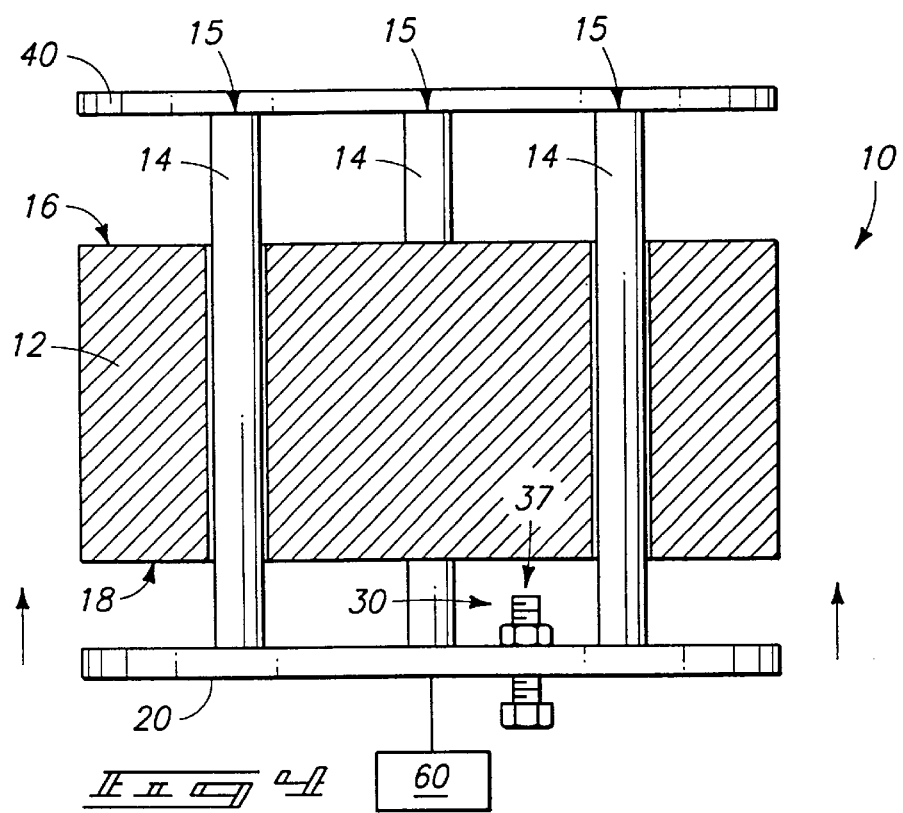

SEMICONDUCTOR PROCESSING APPARATUSES, AND METHODS OF FORMING ANTIREFLECTIVE COATING MATERIALS OVER SUBSTRATES

RELATED PATENT DATA

This patent resulted from a continuation application of U.S. patent application Ser. No. 09/136,883, filed on Aug. 19, 1998, U.S. Pat. No. 6,248,671.

TECHNICAL FIELD

The invention pertains to methods and apparatuses of treating semiconductor wafers, and can have particular applicability to methods of forming antireflective coating materials.

BACKGROUND OF THE INVENTION

Various semiconductor processing procedures involve elevating a wafer above a component to a first predetermined distance for a first treatment, and subsequently lowering the semiconductive wafer relative to a surface of the component for a second treatment. For instance, one process of forming an organic antireflective coating (ARC) involves placing a semiconductive wafer to a first predetermined distance over a hot plate for a first temperature treatment of the wafer, and subsequently lowering the semiconductive wafer directly onto the hot plate for a second temperature treatment. More specifically, a semiconductive wafer coated with a liquid layer of the ARC material is placed over a hot plate to the first predetermined distance. The liquid ARC material is then subjected to a so-called "low temperature bake". The low temperature bake is typically conducted at from about 80° C. to about 110° C., for a time of from about 30 seconds to about 300 seconds, and at about atmospheric pressure. After the low-temperature bake, the wafer is lowered onto the surface of a hot plate and subjected to a "high temperature bake". The high temperature bake is typically conducted at from about 120° C. to about 170° C., for a time of from about 30 seconds to about 120 seconds, and at about atmospheric pressure.

A purpose of the low-temperature processing is to remove solvents prior to the subsequent high-temperature processing. If such solvents were not removed, rapid volatilization could occur in the high-temperature processing to cause splattering of ARC material from the semiconductive wafer. A purpose of the high-temperature processing is to densify the deposited ARC material, as well as to drive off any remaining solvents that weren't completely removed by the low-temperature processing.

The above-described low-temperature and high-temperature processings can be conducted with either a single hot plate, or with a pair of hot plates. If a pair of hot plates are utilized, one of the hot plates is dedicated to low-temperature processing, and the other is dedicated to high-temperature processing. The hot plates can have different surface temperatures. Alternatively, both hot plates can have approximately identical surface temperatures, with the difference in processing temperature being achieved by having the wafer elevationally displaced from the first hot plate during the low-temperature processing, and in physical contact with the heated surface of the second hot plate during the high-temperature processing. The elevational displacement of the low-temperature processing can be achieved with a "fixed holdoff" (i.e, with a structure configured to elevate the wafer above the first hot plate by a fixed distance, such structure can comprise, for example, spherical balls held in a groove in the hot plate, or pins extending between the hot plat and the wafer).

If a single hot plate is utilized for both the low and high temperature processings, the semiconductive wafer is generally supported by rods extending through the hot plate and movable relative to the hot plate. The rods are elevated to hold the semiconductive wafer above the hot plate during the low-temperature processing, and then lowered to lay the semiconductive wafer directly upon the hot plate surface during the high-temperature processing.

The single hot plate methods can be advantageous over dual hot plate methods, in that the processing is simpler. Specifically, the dual hot plate methods require a semiconductive wafer transfer step between a first hot plate utilized for low-temperature processing and a second hot plate utilized for high-temperature processing, and such transfer step is eliminated in single hot plate processes. However, single hot plate processes presently suffer a disadvantage in that it is difficult to accurately and reproducibly control the elevational height of a semiconductive wafer during low-temperature processing steps. Specifically, it is found that the support rods extending through a semiconductive wafer do not always hold a semiconductive wafer at the same height above a hot plate heated surface during repeated low-temperature processing. Subtle variations in height can create variations in the temperature at which a semiconductive wafer is processed, which can adversely cause variability amongst treated semiconductive wafers when multiple semiconductive wafers are processed sequentially. Accordingly, it would be desirable to develop alternative semiconductive processing methods wherein the elevational height of a processed wafer can be more tightly controlled.

SUMMARY OF THE INVENTION

In one aspect, the invention encompasses a semiconductor processing apparatus. The apparatus comprises at least one support member having an upper surface for supporting a semiconductor wafer. The apparatus also comprises a component through which the support member extends. The component has a front surface and a back surface, and at least one of the support member and the component is movable relative to the other of the support member and the component. The apparatus includes a mechanical stop associated with one of the support member and the component and not associated with another of the support member and the component. The mechanical stop engages the other of the support member and the component to which it is not associated when the support member upper surface extends above the component to a predetermined distance.

In another aspect, the invention encompasses a semiconductor processing method. At least one support member is provided. The support member has an upper surface for supporting a semiconductor wafer. A component is provided. The support member extends through the component. The component comprises a front surface and a back surface. At least one of the support member and the component is movable relative to the other of the support member and the component such that the support member can support a wafer in an elevated position above the front surface and can be withdrawn into the component to lower the wafer relative to the front surface of the component. A block is provided to be joined to the support member below the component back surface. The block engages the component back surface when the support member upper surface extends above the component to a predetermined distance. The block prevents the support member upper surface from extending beyond the front surface by more than the predetermined distance. The at least one of the support member and the component is moved to elevate the support member relative to the component until the block is engaged against the component back surface. A semiconductor wafer is provided on the elevated support member upper surface. The component is utilized to treat the semiconductor wafer while the semiconductor wafer is on the elevated support member and elevated above the component to the predetermined distance. The at least one of the support member and the component is moved to lower the semiconductive wafer relative to the component. After the semiconductor wafer is lowered, the component is utilized to treat the semiconductor wafer.

BRIEF DESCRIPTION OF THE DRAWINGS

Preferred embodiments of the invention are described below with reference to the following accompanying drawings.

FIG. 1 is a diagrammatic, schematic, cross-sectional view of a semiconductor wafer processing apparatus of the present invention.

FIG. 2 is a view of the FIG. 1 apparatus shown at a first operational step.

FIG. 3 is a view of the FIG. 1 apparatus shown at a second operational step.

FIG. 4 is a diagrammatic, schematic, cross-sectional view of an alternative construction of a semiconductor wafer processing apparatus of the present invention.

DETAILED DESCRIPTION OF THE PREFERRED EMBODIMENTS

Figure 5:
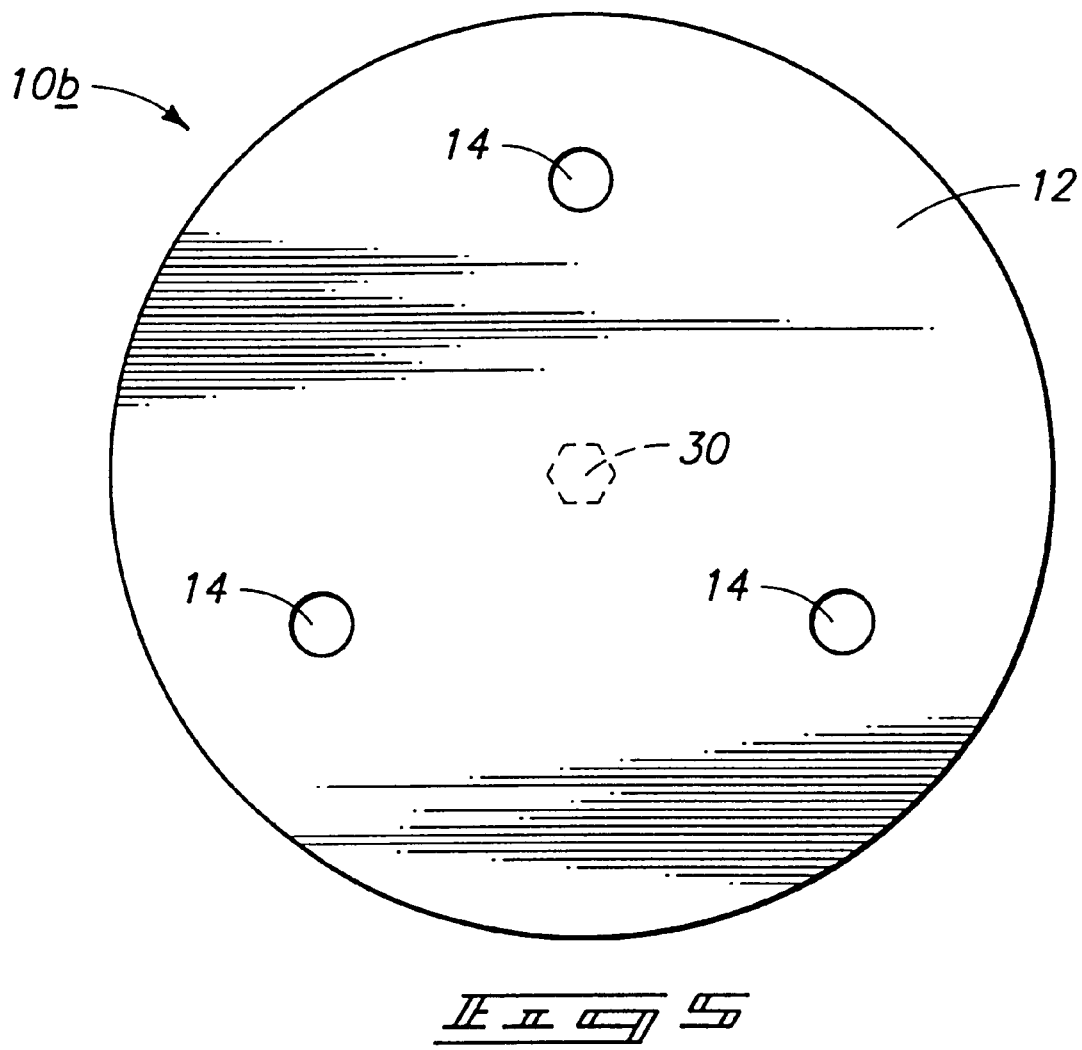
FIG. 5 is a schematic, top-view of a semiconductor wafer processing apparatus of the present invention.

This disclosure of the invention is submitted in furtherance of the constitutional purposes of the U.S. Patent Laws "to promote the progress of science and useful arts" (Article 1, Section 8).

An apparatus 10 of the present invention is illustrated in cross-sectional view in FIG. 1. Apparatus 10 comprises a component 12 having a front surface 16 and a back surface 18. Front surface 16 is preferably configured to treat a semiconductive wafer that is supported on or above front surface 16. For instance, component 12 can comprise a heater, such as, for example, a hot plate, and front surface 16 can be a heated surface of such heater. Component 12 contains a plurality of orifices 22 extending from back surface 18 to front surface 16.

Apparatus 10 further comprises a plurality of support members 14 having uppermost surfaces 15. Upper surfaces 15 of the individual components 14 are preferably all at a common elevational height relative to upper surface 16 of component 12. Support members 14 extend within orifices 22 and through component 12. Support members 14 are joined to a common base 20, which is in turn coupled with a power or driving source 60 configured to move base 20 up and down relative to component 12. Such up and down movement of base 20 slides support members 14 within orifices 22 to vary an elevational displacement of upper surfaces 15 relative to component 12. An example preferred power or driving source would be a pneumatically powered source.

A mechanical stop (block) 30 is joined to base 20, and accordingly is joined to support members 14 through base 20. Block 30 is above base 20 and under component 12, and extends upwardly from base 20 in a direction of component 12. In the shown embodiment, block 30 comprises a screw 32 threadedly engaged with a nut 34. Screw 32 has a head 36 and a threaded extension 38 which extends through nut 34 and into base 20. In operation, screw head 36 engages back surface 18 of component 12 when support member upper surfaces 15 extend above component upper surface 16 to a predetermined distance. Screw head 36 comprises a substantially planar top surface which is stop plane that engages back surface 18. Back surface 18 also comprises a substantially planar surface that functions as a second stop plane. The predetermined distance can be set by adjusting a height of screw head 36 relative to base 20. Nut 34 locks screw 32 in a desired position to fix the distance between screw head 36 and base 20. Upward motion of base 20 is stopped when screw head 36 of block 30 engages back surface 18 of component 12. Accordingly, block 30 can prevent support member upper surfaces 15 from extending beyond front surface 16 of component 12 by more than the predetermined distance. It is noted that the orientation of screw 32 of block 30 can be inverted, as shown in FIG. 4. In such inverted orientation, screw 32 comprises a screw end 37 which engages back surface 18 of component 12 to stop upward movement of support members 14.

In the shown embodiments, block 30 is removably joined to base 20, and adjustable so that a predetermined distance can be varied. It is to be understood, however, that the invention encompasses other embodiments (not shown) wherein block 30 is permanently affixed to base 20 by, for example, welding or gluing, such that block 30 is not removable from base 20, and such that a predetermined distance is fixed. Also, it is noted that in the shown embodiment block 30 is configured to physically contact back surface 18 of component 12 as block 30 engages back surface 18. However, the invention encompasses other embodiments (not shown) wherein block 30 engages back surface 18 through one or more intermediate structures provided between back surface 18 and block 30.

Operation of apparatus 10 is described with reference to FIGS. 2 and 3. Referring to FIG. 2, a semiconductor wafer 40 is provided to be supported by upper surfaces 15 of support members 14. Semiconductor wafer 40 can comprise, for example, a wafer of monocrystalline silicon, and can be provided on upper surfaces 15 by conventional methods. Base 20 is pushed upwardly by power source 60, either before or after provision of semiconductor wafer 40, until block 30 engages back surface 18 of component 12. Semiconductor wafer 40 is thus provided at a predetermined distance above front surface 16 of component 12.

Semiconductor wafer fragment 40 is subjected to first processing conditions while it is elevated above front surface 16 by the predetermined distance. For instance, in one embodiment of the invention component 12 comprises a heater (such as, for example, a hot plate) and a liquid ARC material (not shown) as provided over an upper surface of semiconductor wafer 40. Front surface 16 of component 12 is a heated surface, and the pre-determined distance by which wafer 40 is elevated over front surface 16 is chosen such that the ARC material is heated to a first temperature of from about 80° C. to about 110° C. The heating preferably continues for a time of from about 30 seconds to about 300 seconds to accomplish a low-temperature processing.

After wafer fragment 40 is subjected to the first processing conditions, base 20 is lowered as shown in FIG. 3. Such lowering encompasses lowering support members 14 into component 12. In the shown embodiment, the lowering leaves semiconductor wafer 40 supported on front surface 16 of component 12. In the above-described embodiment in which component 12 is a heater and is utilized for treating an ARC material, the lowering of support members 14 places the ARC material in closer proximity to heated front surface 16 of component 12. The closer proximity causes the ARC material to heat to a second temperature that is higher than the first temperature to which it was heated in the step of FIG. 2. Preferably, such second temperature is from about 120° C. to about 170° and is maintained for from about 30 seconds to about 120 seconds. After the heating to the second temperature, wafer 40 can be removed from over component 12 by conventional methods.

It is noted that in the above-described embodiments, support members 14 are moved relative to component 12. It is to be understood, however, that the invention encompasses other embodiments (not shown) wherein component 12 is moved relative to support members 14. Additionally, it is noted that in the shown embodiment mechanical stop 30 is associated with support members 14 (through base 20) and engages component 12. However, the invention encompasses other embodiments (not shown) wherein mechanical stop 30 is associated with component 12 and engages support members 14 (such as, for example, through base 20).

A preferred embodiment orientation of support members 14 and block 30 is described with reference to FIG. 5. Specifically, FIG. 5 illustrates a top view of a preferred apparatus 10b of the present invention. In describing apparatus 10b, similar numbering to that utilized in describing the apparatus of FIGS. 1–3 will be used, with differences indicated by the suffix "b" or by different numerals. Apparatus 10b comprises three support members 14 extending through a component 12. Apparatus 10b further comprises a block 30 (shown in phantom view) centrally located relative to the three support members 14. Block 30 and support members 14 are joined to a base (not shown) analogous to base 20. The central location of block 30 can provide more balanced forces relative to support members 14 when block 30 is engaged against component 12 than would otherwise occur if block 30 were not centrally located.

In the shown embodiments, the apparatuses comprise three support members 14. It is to be understood, however, that the invention encompasses other embodiments (not shown) wherein less than three support members are utilized, and encompasses yet other embodiments (not shown) wherein more than three support members are utilized.

Also, it is noted that the embodiments of the invention described above are described with specific application to a process for heating a semiconductor wafer to treat an antireflective coating material. However, it is to be understood that the invention can have application to any semiconductor wafer fabrication process wherein a wafer is to be elevated above a component to an initial first distance, and subsequently is to be provided to a lower elevation relative to a surface of the component.

In the above-described embodiments, the semiconductor wafer is supported on a surface of the component when the support members (14) are retracted into component 12. However, it is to be understood that the invention encompasses other embodiments (not shown) wherein additional support members are provided between an upper surface of component 12 and wafer 40, and wherein wafer 40 is supported on such other components as support members 14 are withdrawn.

FIGS. 1–5 illustrate the relative orientations of component 12 and support structures 14, and do not show supporting hardware attached to component 12 and support structures 14. However, it is to be understood that component 12 and support structures 14 will generally have hardware associated therewith to support them and hold them in the shown relative orientations. The fabrication of such supporting hardware is well within the skill of persons of ordinary skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

providing at least one support member having an upper surface for supporting a semiconductor wafer;

providing a component through which the support member extends, the component comprising a front surface and a back surface;

moving at least one of the support member and the component to elevate the support member relative to the component until a mechanical stop engages with one of the support member or the component to cease elevation of the support member at a predetermined distance above the front surface of the component;

providing a semiconductor wafer on the elevated support member upper surface;

utilizing the component to treat the semiconductor wafer while the semiconductor wafer is on the elevated support member and elevated above the component to the predetermined distance;

moving the at least one of the support member and the component to lower the semiconductive wafer relative to the component; and after the semiconductor wafer is lowered, utilizing the component to treat the semiconductor wafer.

2. The method of claim 1 wherein the lowering the semiconductor wafer comprises lowering the semiconductive wafer until it is supported on the front surface of the component.

3. The method of claim 1 wherein the support member is movable relative to the component.

4. The method of claim 1 wherein the component comprises a heater and the front surface is a heated surface of the heater; wherein the utilizing the component to treat the semiconductor wafer while the semiconductor wafer is elevated to the predetermined distance comprises heating the semiconductor wafer to a first temperature; and wherein the utilizing the component to treat the semiconductor wafer after the semiconductor wafer is lowered relative to the component comprises heating the semiconductor wafer to a second temperature which is greater than the first temperature.

5. The method of claim 4 wherein the lowering the semiconductor wafer comprises lowering the semiconductor wafer until it is supported on the front surface of the component, and wherein the heating the semiconductor wafer to the second temperature occurs while the semiconductor wafer is supported on the front surface of the component.

6. A semiconductor processing method comprising:

providing at least one support member having an upper surface for supporting a semiconductor wafer;

providing a component through which the support member extends, the component comprising a front surface and a back surface;

providing a block joined to the support member below the component back surface, the block engaging the component back surface when the support member upper surface extends above the component to a predetermined distance, the block preventing the support member upper surface from extending beyond the front surface by more than the predetermined distance;

moving at least one of the support member and the component to elevate the support member relative to the component until the block is engaged against the component back surface;

providing a silicon-containing wafer on the elevated support member upper surface;

utilizing the component to treat the wafer while the wafer is on the elevated support member and elevated above the component to the predetermined distance;

moving the at least one of the support member and the component to lower the wafer relative to the component; and after the wafer is lowered, utilizing the component to treat the wafer.

7. The method of claim 6 wherein the lowering the wafer comprises lowering the wafer until it is supported on the front surface of the component.

8. The method of claim 6 wherein the support member is movable relative to the component.

9. The method of claim 6 wherein the at least one support member is at least three support members.

10. The method of claim 6 wherein the component comprises a heater and the front surface is a heated surface of the heater; wherein the utilizing the component to treat the wafer while the wafer is elevated to the predetermined distance comprises heating the wafer to a first temperature; and wherein the utilizing the component to treat the wafer after the wafer is lowered relative to the component comprises heating the wafer to a second temperature which is greater than the first temperature.

11. The method of claim 10 wherein the lowering the wafer comprises lowering the wafer until it is supported on the front surface of the component, and wherein the heating the wafer to the second temperature occurs while the wafer is supported on the front surface of the component.

12. The method of claim 6 wherein the block is removably joined to the support member.

13. The method of claim 6 wherein the block comprises a screw.

14. A method of forming an antireflective coating material over a substrate comprising:

providing at least one support member having an upper surface for supporting a silicon-containing wafer;

providing a heater through which the support member extends, the heater comprising a heated front surface and a back surface;

providing a block joined to the support member below the component back surface, the block engaging the heater back surface when the support member upper surface extends above the heater front surface to a predetermined distance, the block preventing the support member upper surface from extending beyond the front surface by more than the predetermined distance;

moving at least one of the heater and the support member to elevate the support member relative to the heater until the block is engaged;

providing a wafer on the elevated support member upper surface, the wafer comprising a liquid antireflective coating over a surface of the wafer;

utilizing the heater to heat the wafer to a first temperature while the wafer is on the elevated support member and above the heater front surface by the predetermined distance;

moving the one of the support member and the heater to lower the wafer relative to the front surface of the heater; and after lowering the wafer, utilizing the heater to heat the wafer to a second temperature, the second temperature being greater than the first temperature, the antireflective coating being solidified after the heating to the second temperature.

15. The method of claim 14 wherein the lowering the wafer comprises lowering the wafer until it is supported on the front surface of the heater.

16. The method of claim 14 wherein the moving at least one of the support member and the heater comprises moving the support member.

17. The method of claim 14 wherein the block is removably joined to the support member.

18. The method of claim 14 wherein the block comprises a screw.

* * * * *